(12) United States Patent
Kim et al.

(10) Patent No.: US 12,354,643 B2
(45) Date of Patent: Jul. 8, 2025

(54) STORAGE DEVICE AND STORAGE SYSTEM INCLUDING PUF

(71) Applicant: SAMSUNG ELECTRONICS CO., LTD., Suwon-si (KR)

(72) Inventors: Hyungseuk Kim, Suwon-si (KR); Yongjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 17/986,556

(22) Filed: Nov. 14, 2022

(65) Prior Publication Data
US 2023/0154525 A1     May 18, 2023

(30) Foreign Application Priority Data

Nov. 12, 2021 (KR) .................. 10-2021-0155797
Jul. 19, 2022 (KR) .................. 10-2022-0089201

(51) Int. Cl.
| | | |
|---|---|---|
| G11C 29/00 | (2006.01) | |
| G11C 11/4078 | (2006.01) | |
| G11C 11/4094 | (2006.01) | |
| G11C 11/4096 | (2006.01) | |
| G11C 29/52 | (2006.01) | |

(52) U.S. Cl.
CPC ...... *G11C 11/4078* (2013.01); *G11C 11/4094* (2013.01); *G11C 11/4096* (2013.01); *G11C 29/52* (2013.01)

(58) Field of Classification Search
CPC ............ G11C 11/4078; G11C 11/4094; G11C 11/4096; G11C 29/52; G11C 16/22; G11C 7/24; G11C 2029/0411; G11C 29/42
See application file for complete search history.

(56) References Cited

U.S. PATENT DOCUMENTS

| | | | |
|---|---|---|---|
| 7,681,103 B2 | 3/2010 | Devadas et al. | |
| 9,088,278 B2 | 7/2015 | Pfeiffer et al. | |
| 9,093,128 B2 | 7/2015 | Otterstedt et al. | |
| 9,990,181 B2 | 6/2018 | La Fratta et al. | |
| 10,078,494 B2 | 9/2018 | Clark et al. | |
| 10,468,104 B1 * | 11/2019 | Anand | G11C 16/3459 |
| 10,607,033 B2 | 3/2020 | Kuenemund et al. | |
| 10,666,438 B2 | 5/2020 | Tsai et al. | |
| 10,764,069 B1 * | 9/2020 | Hurwitz | H04L 9/0866 |
| 10,970,046 B2 | 4/2021 | Cheng | |

(Continued)

FOREIGN PATENT DOCUMENTS

| | | | | |
|---|---|---|---|---|
| FR | 2838233 A1 * | 10/2003 | | G11C 17/18 |
| KR | 10-2021-0004076 A | 1/2021 | | |

*Primary Examiner* — Mushfique Siddique
(74) *Attorney, Agent, or Firm* — Sughrue Mion, PLLC

(57) ABSTRACT

A storage device includes: a memory cell array including a plurality of memory cells connected to a plurality of word lines and a plurality of bit lines; a physical unclonable function (PUF) circuit configured to output PUF data based on a voltage difference between two memory cells from among the plurality of memory cells, the two memory cells being connected to a word line from among the plurality of word lines and two bit lines from among the plurality of bit lines, and to which a same data are programmed; and a memory controller configured to receive the PUF data from the PUF circuit, and program the PUF data or an inverted value of the PUF data to one of the two memory cells based on a value of the PUF data.

19 Claims, 10 Drawing Sheets

(56) References Cited

U.S. PATENT DOCUMENTS

| | | |
|---|---|---|
| 11,017,128 B2 | 5/2021 | Courtney |
| 12,087,397 B1* | 9/2024 | Asnaashari ............ G06F 3/0655 |
| 2015/0278551 A1* | 10/2015 | Iyer ......................... G06F 21/73 |
| | | 726/34 |
| 2017/0011790 A1* | 1/2017 | Juvekar ................ G11C 11/2295 |
| 2017/0200508 A1* | 7/2017 | Grigoriev ............. H04L 9/0866 |
| 2018/0039484 A1 | 2/2018 | La Fratta et al. |
| 2018/0337793 A1* | 11/2018 | Park ........................ G11C 16/28 |
| 2020/0084052 A1* | 3/2020 | O'Connell ............ H04L 9/3278 |
| 2020/0210628 A1* | 7/2020 | Karpinskyy ........... H04L 9/0866 |
| 2020/0213138 A1 | 7/2020 | Mondello et al. |
| 2020/0274722 A1 | 8/2020 | La Rosa et al. |
| 2021/0055912 A1 | 2/2021 | Zalivaka et al. |
| 2022/0383927 A1* | 12/2022 | Jung ................... G11C 11/2255 |

\* cited by examiner

STORAGE DEVICE AND STORAGE SYSTEM INCLUDING PUF

CROSS-REFERENCE TO RELATED APPLICATION

This application claims priority to Korean Patent Application No. 10-2021-0155797 filed on Nov. 12, 2021, and Korean Patent Application No. 10-2022-0089201 filed on Jul. 19, 2022, in the Korean Intellectual Property Office, the contents of which are incorporated by reference herein in their entireties.

BACKGROUND

1. Field

The disclosure relates to a storage device, and more specifically to a storage device with a physical unclonable function and a storage system including the same.

2. Description of the Related Art

A storage device stores data according to control by a host device such as a computer, a smartphone, or a smart pad. The storage device includes a device for storing data on a magnetic disk such as a hard disk drive (HDD), and a device for storing data in a semiconductor memory, particularly a non-volatile memory, such as a solid-state drive (SSD) or a memory card.

As security demands on the data stored in the storage device increase, storage devices with a physical unclonable function (PUF) are currently developed.

The above information disclosed in this Background section is only for enhancement of understanding of the background of the invention, and therefore it may contain information that does not form the prior art that is already known in this country to a person of ordinary skill in the art.

SUMMARY

Provided is a storage device for improving security.

According to an aspect of an example embodiment, a storage device includes: a memory cell array including a plurality of memory cells connected to a plurality of word lines and a plurality of bit lines; a physical unclonable function (PUF) circuit configured to output PUF data based on a voltage difference between two memory cells from among the plurality of memory cells, the two memory cells being connected to a word line from among the plurality of word lines and two bit lines from among the plurality of bit lines, and to which a same data are programmed; and a memory controller configured to receive the PUF data from the PUF circuit, and program the PUF data or an inverted value of the PUF data to one of the two memory cells based on a value of the PUF data.

According to an aspect of an example embodiment, a storage system includes: a memory device including a plurality of memory cells connected to a plurality of word lines and a plurality of bit lines, wherein the plurality of memory cells are programmed with security data and error correction code (ECC) parity on the security data, and the security data includes arbitrary logic values and inverted logic values of the arbitrary logic values; and a memory controller configured to generate an authentication key based on the security data.

According to an aspect of an example embodiment, a method for operating a storage device, includes: programming same data to a plurality of memory cell pairs corresponding to each of a plurality of bit lines; reading physical unclonable function (PUF) data based on a voltage difference between a first memory cell and a second memory cell included in a respective memory cell pair among the plurality of memory cell pairs; programming one of the PUF data and an inverted value of the PUF data to the first memory cell or the second memory cell based on the PUF data; and generating security data based on values stored in the first memory cell and the second memory cell.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
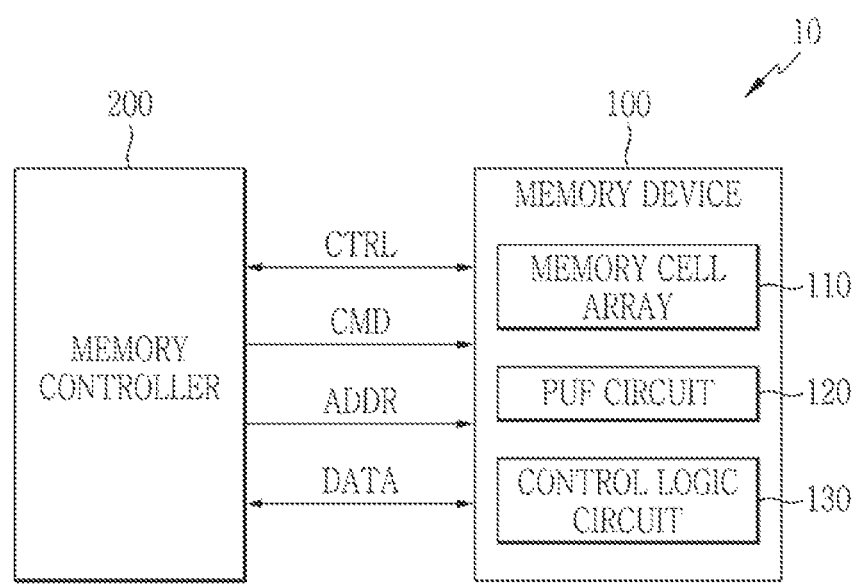
FIG. 1 shows a block diagram of a memory system according to an embodiment.

In the following detailed description, certain embodiments of the present disclosure are shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification.

An expression recited in the singular may be construed as singular or plural unless the expression "one", "single", etc., is used. Terms including ordinal numbers such as first, second, and the like, will be used only to describe various components, and are not to be interpreted as limiting these components. The terms may be only used to differentiate one component from others.

FIG. 1 shows a block diagram of a memory system according to an embodiment.

Referring to FIG. 1, the memory system 10 includes a memory device 100 and a memory controller 200. For example, the memory system 10 may be realized with a storage device such as a solid-state drive (SSD), an embedded memory, and/or an attachable/detachable external memory.

The memory device 100 and the memory controller 200 may be connected to each other through a memory interface and may transmit/receive signals to/from each other through the memory interface.

The memory device 100 includes a memory cell array 110, a physical unclonable function (PUF) circuit 120, and a control logic circuit 130. The memory device 100 may have a cell over periphery (COP) structure. The memory device 100 may have a bonding-vertical NAND (B-VNAND) structure.

The memory cell array 110 includes a plurality of memory cells defined by a plurality of rows and a plurality of columns. For example, the plurality of memory cells may be (NAND, Not AND) flash memory cells, and the present disclosure is not limited thereto.

The control logic circuit 130 may control the memory cell array 110 to store data DATA acquired from the memory controller 200, and/or control the memory cell array 110 to output the stored data DATA to the memory controller 200.

The PUF circuit 120 may be connected to the memory cell array 110, may generate PUF data by using the memory cell array 110, and may output the generated PUF data. Here, the PUF data may be generated based on a difference between unique output voltages of two arbitrary memory cells. A memory cell for generating the PUF data will be referred to as a PUF cell. The PUF cell may be an arbitrary cell among a plurality of cells in the memory cell array 110.

The PUF circuit 120 may generate the PUF data by comparing unique values corresponding to hardware based on intrinsic characteristics of the hardware. For example, when a plurality of pieces of hardware such as semiconductor devices included in a semiconductor chip are manufactured by a same process, the plurality of respective pieces of hardware may not completely correspond to each other, and small hardware changes may be generated among the plurality of pieces of hardware regarding manufacturing specifications. For example, there may be slight differences of doping concentrations and channel lengths among the plurality of pieces of hardware. As another example, a nonvolatile memory including a NAND flash may form a cell distribution when data are programmed to the memory cell. The doping concentrations and the channel lengths of the respective memory cells may be slightly different for the respective memory cells according to a process distribution. Unique values of the hardware may be extracted based on the hardware changes, and the extracted values may be used in applications needing security, for example, security communication, security data processing, user identification, or firmware updates. The PUF data may signify a unique value generated based on the hardware changes or a set unique values generated based on the hardware changes.

The memory controller 200 may generate a unique key used for encryption of data, such as an authentication key or a random key, based on (by using) the PUF data.

The control logic circuit 130 may generally control various operations of the memory device 100 based on the command CMD, the address ADDR, and the control signal CTRL received from the memory controller 200. For example, the control logic circuit 130 may program the data DATA to the memory cell array 110, or may generate various control signals for reading the data DATA from the memory cell array 110. The control logic circuit 130 may generate various control signals for generating the PUF data from the memory cell array 110.

The memory controller 200 may control the operation of the memory device 100 by providing signals to the memory device 100.

For example, the signals may include a command CMD, an address ADDR, and a control signal CTRL. The memory controller 200 may provide the command CMD, the address ADDR, and the control signal CTRL to the memory device 100, may access the memory cell array 110, and may control a memory operation such as reading data, programming data, or erasing data. According to the read operation, the data DATA are transmitted to the memory controller 200 from the memory cell array 110. According to the program operation, the data DATA may be transmitted to the memory cell array 110 from the memory controller 200.

The memory controller 200 may control the memory cell array 110 to output the PUF data by providing the command CMD, the address ADDR, and the control signal CTRL to the memory device 100. For example, the memory controller 200 may control the memory device 100 so that the memory device 100 may output the PUF data, and the memory controller 200 may generate security data based on the received PUF data. The memory controller 200 may provide the generated security data to the memory device 100 and program the same to the memory cell array 110. The security data may be generated by selecting two PUF cells among the plurality of memory cells in the memory cell array 110, so a plurality of security data may be generated by selecting different PUF cells for each of the security data, and the plurality of security data may be stored in the memory device 100.

Figure 2:
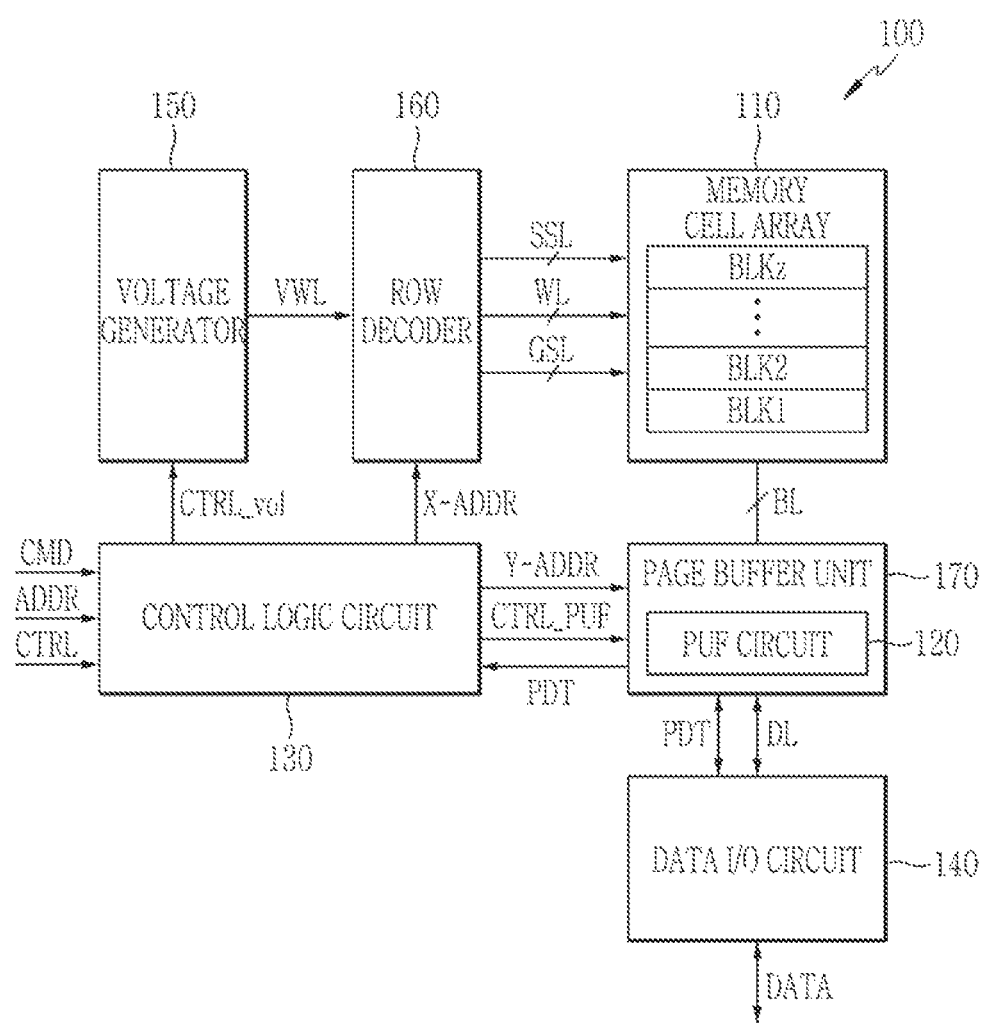
FIG. 2 shows a block diagram of a memory device according to an embodiment.

FIG. 2 shows a block diagram of a memory device according to an embodiment.

Referring to FIG. 2, the memory device 100 may include a memory cell array 110, a PUF circuit 120, a control logic circuit 130, a data input and output circuit 140, a voltage generator 150, a row decoder 160, and a page buffer circuit 170.

The memory cell array 110 may include a plurality of memory blocks BLK1 to BLKz (z being a positive integer). The memory blocks BLK1 to BLKz may respectively include a plurality of memory cells. The memory cell array 110 may be divided into a main region and a spare region. Main data may be stored in the main region, and additional data such as an error correction code (ECC) parity bit may be stored in the spare region. The memory cell array 110 may be connected to the page buffer circuit 170 or the PUF circuit 120 through a bit line BL, and may be connected to the row decoder 160 through a word line WL, a string select line SSL, and a ground select line (GSL). The bit line BL may be arranged in a direction extending to a second side of the memory cell array 110 from a first side thereof. An "order of the bit line" will be assumed to be an order in which the bit line BL is arranged in one direction.

The PUF circuit 120 may be connected to two arbitrary bit lines BL of the memory cell array 110 based on a PUF control signal CTRL_PUF. The PUF circuit 120 may generate PUF data based on a difference of unique output voltages of two PUF cells, and may output the PUF data to the data input and output circuit 140. The two PUF cells may be selected from a plurality of cells connected to an arbitrary word line WL.

The control logic circuit 130 may output various control signals based on the command CMD, the address ADDR, and the control signal CTRL. For example, the control logic circuit 130 may output control signals for programming data to the memory cell array 110, reading data from the memory cell array 110, or erasing data stored in the memory cell array 110, such as, for example, a voltage control signal CTRL_vol, a row address X-ADDR, and a column address (Y-ADDR. As another example, the control logic circuit 130 may output control signals for the PUF circuit 120 to generate PUF data, such as, for example, a PUF the control signal CTRL_PUF and a voltage control signal CTRL_vol. The control logic circuit 130 may receive PUF data PDT generated by the PUF circuit 120 based on the PUF control signal CTRL_PUF. The control logic circuit 130 may output the control signals for programming data or erasing data, based on the received PUF data PDT The control logic circuit 130 may output the voltage control signal CTRL_vol, the row address X-ADDR, and the column address Y-ADDR to perform a read operation and/or a program operation on the plurality of memory cells included in the memory cell array 110 for respective pages, and/or perform an erase operation for respective memory blocks.

The voltage generator 150 may generate various types of voltages for performing the program, read, and/or erase operations on the memory cell array 110 based on the voltage control signal CTRL_vol. For example, the voltage generator 150 may generate a program voltage, a read voltage, a program verify voltage, and an erase voltage with a word line voltage VWL. The voltage generator 150 may further generate a string select line voltage and a ground select line voltage based on the voltage control signal CTRL_vol. The voltage generator 150 may generate various types of voltages for performing a PUF data generating operation by the PUF circuit 120 based on the voltage control signal CTRL_vol. For example, the voltage generator 150 may generate a reset voltage Vrst and an act voltage Vact.

The row decoder 160 may select one of the memory blocks BLK1 to BLKz based on the row address X-ADDR, may select one of the word line WL of the selected memory block, and may select one of string select lines SSL and one of ground select lines GSL. For example, when the program operation is performed, the row decoder 160 may apply a program voltage and a program verify voltage to the selected word line WL, and when the read operation is performed, the row decoder 160 may apply a read voltage to the selected word line WL.

The page buffer circuit 170 may select at least one bit line BL among a plurality of bit lines BL based on the column address Y-ADDR. In detail, the page buffer circuit 170 may function as a programming driver or a sensing amplifier according to an operation mode. For example, when a program operation is performed, the page buffer circuit 170 may apply the bit line voltage corresponding to data to be programmed to the selected bit line. When the read operation is performed, the page buffer circuit 170 may sense a current or a voltage of the selected bit line and may sense the data stored in the memory cell.

Figure 3:
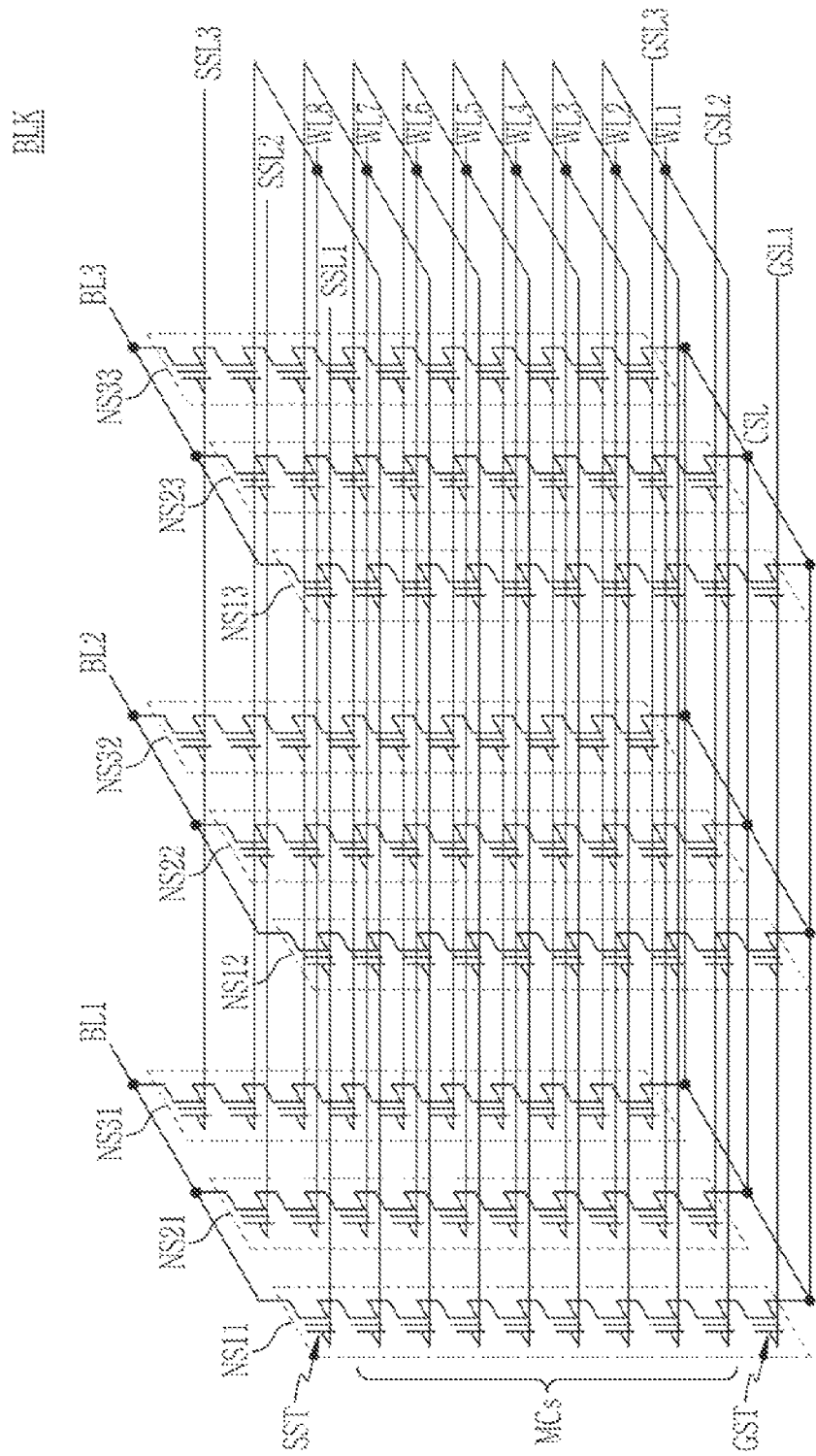
FIG. 3 shows a circuit diagram of a memory block according to an embodiment.

FIG. 3 shows a circuit diagram of a memory block according to an embodiment.

Referring to FIG. 3, the memory block BLK may correspond to one of the memory blocks BLK1 to BLKz shown in FIG. 2. The memory block BLK may include NAND strings NS11 to NS33, and the respective NAND strings may include a string select transistor SST coupled in series, a plurality of memory cells MCs, and a ground select transistor GST. The transistors SST and GST and the memory cells MCs included in the respective NAND strings may be perpendicularly stacked on the substrate.

The word lines WL1 to WL8 may extend in a second horizontal direction, and the bit lines BL1 to BL3 may extend in the first horizontal direction. The NAND strings NS11, NS21, and NS31 may be positioned between the first bit line BL1 and the common source line CSL, the NAND strings NS12, NS22, and NS32 may be positioned between the second bit line BL2 and the common source line CSL, and the NAND strings NS13, NS23, and NS33 may be positioned between the third bit line BL3 and the common source line CSL. The string select transistor SST may be connected to the corresponding string select lines SSL1 to SSL3. The memory cells MCs may be connected to the corresponding word lines WL1 to WL8. The ground select transistor GST may be connected to the corresponding ground select lines GSL1 to GSL3. The string select transistor SST may be connected to the corresponding bit line, and the ground select transistor GST may be connected to the common source line CSL. Here, the number of the NAND strings, the number of the word lines, the number of the bit lines, the number of the ground select lines, and the number of the string select lines are changeable in various ways depending on embodiments.

Figure 4:
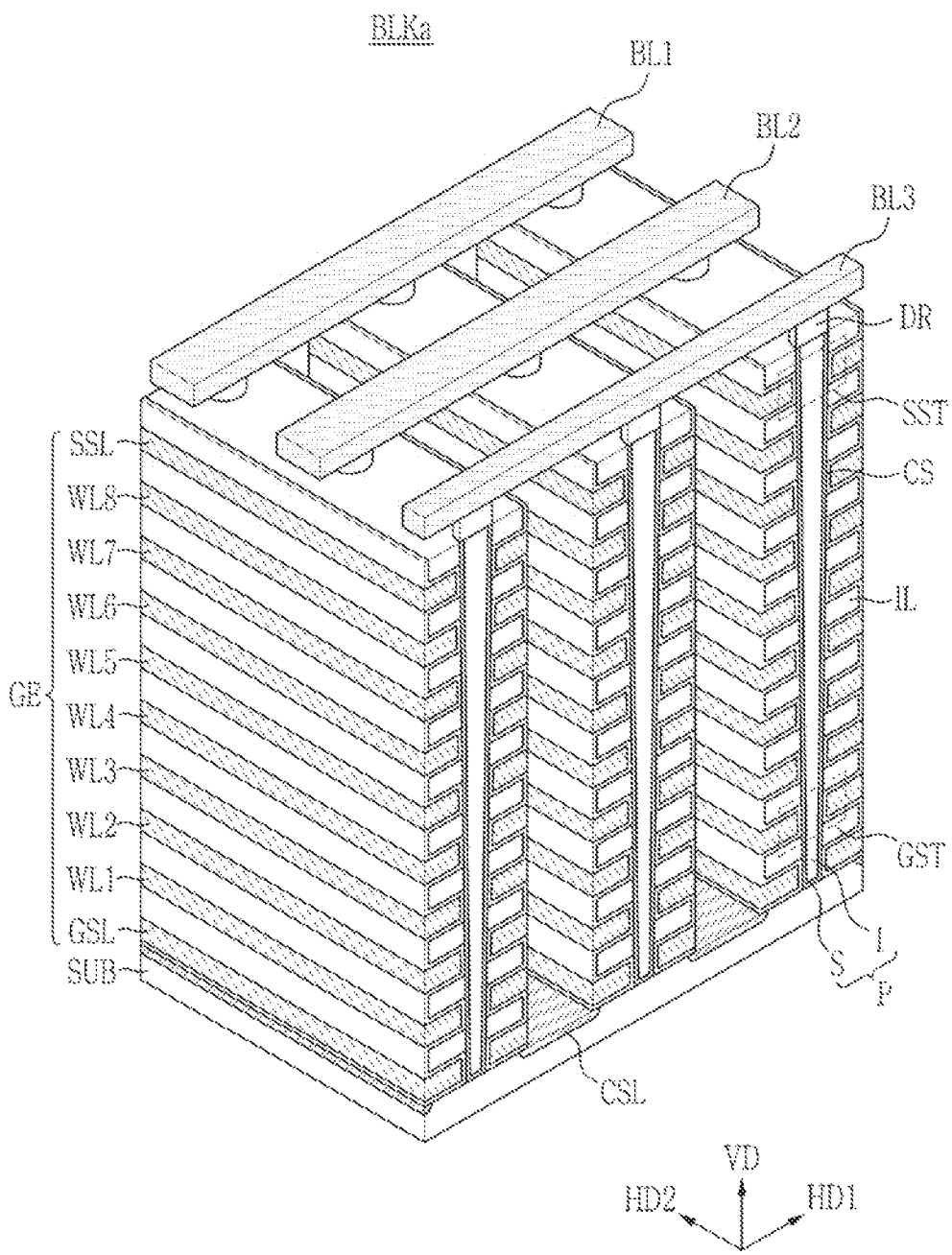
FIG. 4 shows a perspective view of a memory block according to an embodiment.

FIG. 4 shows a perspective view of a memory block according to an embodiment.

Referring to FIG. 4, the memory block BLKa may correspond to one of the memory blocks BLK1 to BLKz shown in FIG. 2. The memory block BLKa is formed to be perpendicular to the substrate SUB. The substrate SUB has a first conductivity type (e.g., p type) and expands in the second horizontal direction HD2 on the substrate SUB, and a common source line CSL on which a second conductivity type (e.g., n type) impurities are doped may be provided.

A plurality of insulation layers IL expanding in the second horizontal direction HD2 may be sequentially provided in the vertical direction VD to a region of the substrate SUB between two adjacent common source lines CSL. For example, the plurality of insulation layers IL may include an insulating material such as a silicon oxide. The plurality of insulation layers IL may be spaced from each other by a specific distance in the vertical direction VD.

A plurality of pillars P may be sequentially disposed in the first horizontal direction HD1 in a region of the substrate SUB between the two adjacent common source lines CSL. The plurality of pillars P may penetrate a plurality of insulation layers IL in the vertical direction VD and may contact the substrate SUB. In detail, surface layers S of the respective pillars P may include a first-type silicon material and may function as a channel region. Internal layers I of the respective pillars P may include an insulating material such as a silicon oxide, or air gaps.

The charge storage layer CS may be provided along exposed surfaces of the insulation layers IL, the pillars P, and the substrate SUB in the region between the two adjacent common source lines CSL. The charge storage layer CS may include a gate insulating layer, a charge trap layer, and a blocking insulation layer. Gate electrodes GE such as the select lines GSL and SSL and the word lines WL1 to WL8 may be provided in the region between the two adjacent common source lines CSL on the exposed surface of the charge storage layer CS.

Drains or drain contacts DR may be provided on the plurality of pillars P. For example, the drains or the drain contacts DR may include silicon materials to which impurities with a second conductivity type are doped. The bit lines BL1 to BL3 expanding in the first horizontal direction HD1 and spaced by a specific distance in the second horizontal direction HD2 are provided on the drains DR.

Figure 5:
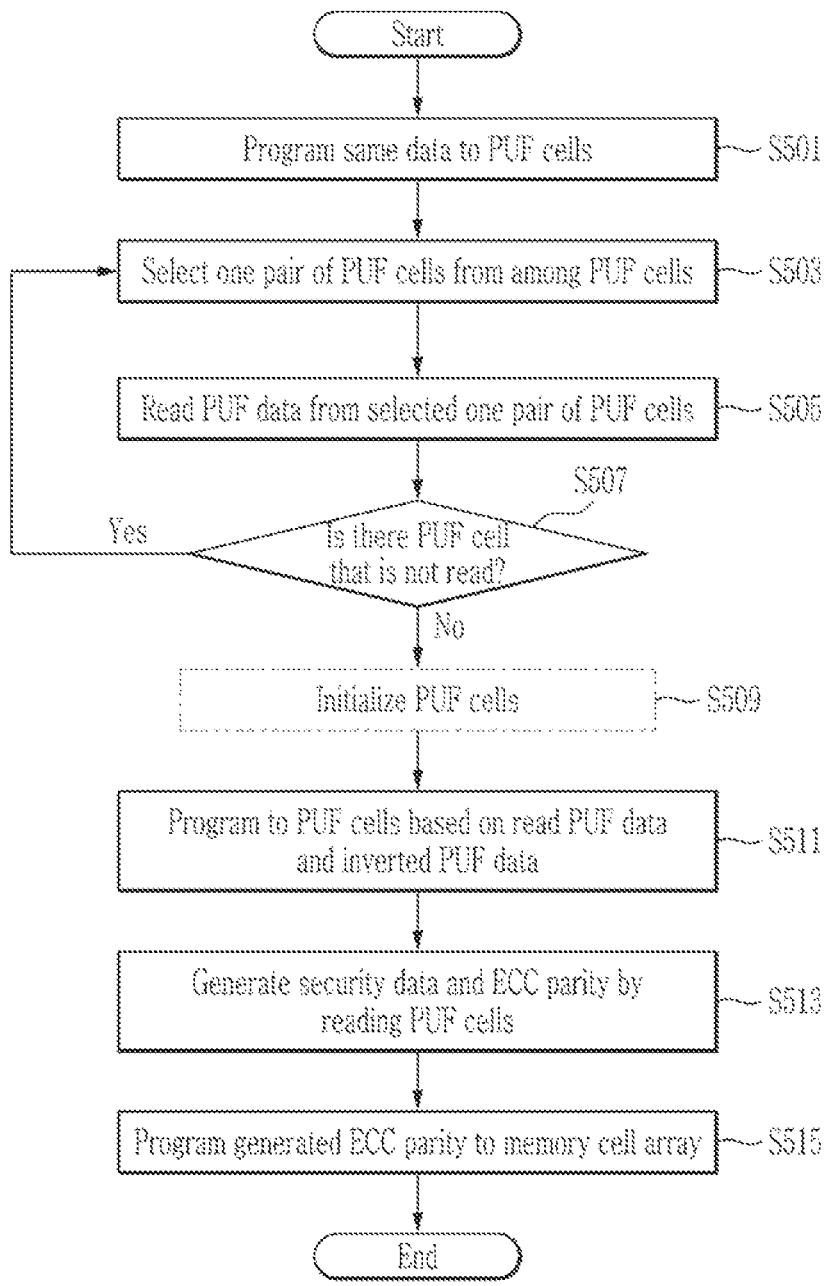
FIG. 5 shows a flowchart of a method for operating a memory system according to an embodiment.

FIG. 5 shows a flowchart of a method for operating a memory system according to an embodiment.

Referring to FIG. 5, the method for operating a memory system 10 may be performed by the memory device 100 to generate PUF data. In various embodiments, the memory controller 200 may control the memory device 100 to generate the PUF data. In various embodiments, the control logic circuit 130 in the memory device 100 may control the memory device 100 to generate the PUF data.

At S501, the memory controller 200 programs data to plurality of PUF cells.

The memory controller 200 may program the same data to the plurality of PUF cells through the page buffer circuit 170. The PUF cells may be a set of two PUF cells making a pair.

At S503, the memory controller 200 selects a pair of PUF cells from the plurality of PUF cells.

The memory controller 200 may select a pair of PUF cells from the plurality of PUF cells based on predetermined bit line select information. The pair of PUF cells are connected to a word line WLx (x being an arbitrary natural number), and may be connected to two arbitrary bit lines BLm and BLn (m and n being arbitrary natural numbers). The bit line select information may include order information on the two arbitrary bit lines selected from a plurality of bit lines BL1 to BLz (z being an arbitrary natural number). The memory controller 200 may sequentially select two arbitrary bit lines based on bit line select information.

The two arbitrary bit lines BLm and BLn may be positioned near each other, and without being limited thereto, other bit lines may be positioned between them. The PUF cells of the bit lines BLm and BLn positioned near each other may have a similar process characteristic with a high probability. Therefore, it may be desirable for other bit lines to be positioned between the two arbitrary bit lines BLm and BLn according to the characteristic of the PUF circuit 120 for generating a random digital value that is difficult to be predicted. Here, a processing deviation between the memory blocks may be big so it may be preferable for the two arbitrary bit lines BLm and BLn to be selected within one memory block.

At S505, the memory controller 200 reads the PUF data for the selected pair of PUF cells.

In detail, the memory controller 200 transmits a command CMD including a PUF read operation to the memory device 100. The control logic circuit 130 transmits the PUF control signal CTRL_PUF to the PUF circuit 120 based on the command CMD. The PUF circuit 120 may generate PUF data PDT based on the difference of the respective output voltages of the pair of PUF cells based on the PUF control signal CTRL_PUF, and may output the PUF data PDT. A voltage difference between the PUF cells may be generated by process differences. For example, the PUF control signal CTRL_PUF may include a bit line select signal BS, a reset signal RST, and an act signal ACT.

It has been described above that the memory controller 200 programs the same data to a plurality of PUF cells through the page buffer circuit 170 and transmits the command CMD including a PUF read operation to the memory device 100, and the memory controller 200 may transmit the command CMD including a PUF read operation to the memory device 100, may program the same data to a plurality of PUF cells through the page buffer circuit 170, may generate PUF data PDT, and may output the PUF data PDT.

The memory controller 200 may read the PUF data according to the method described with reference to FIG. 6 and FIG. 7.

At S507, the memory controller 200 determines whether there are PUF cells that are not read.

When there are PUF cells that are not read in the memory cell array 110, the memory controller 200 may perform the operation of S503. The memory controller 200 may output a plurality of PUF data PDT by performing the operation of S503 multiple times until there are no longer PUF cells that are not read. The PUF data PDT output by the PUF circuit 120 may be transmitted to the memory controller 200 and/or the control logic circuit 130 through the data input and output circuit 140.

When there are no PUF cells that are not read in the memory cell array 110, the memory controller 200 may perform a next operation.

At S509, when the data of "0" is programmed to the plurality of PUF cells, the memory controller 200 initializes the plurality of PUF cells. In detail, the memory controller 200 may control the memory device 100 to erase the data programmed to the plurality of PUF cells.

When no data are programmed to the plurality of PUF cells (i.e., when the plurality of PUF cells are initialized with the data of "1" at S501), the memory controller 200 may not perform the operation S509 for initializing the plurality of PUF cells but may perform the operation of S511.

At S511, the memory controller 200 programs to a plurality of PUF cells based on a plurality of PUF data PDT that are read and a plurality of inverted PUF data that are generated by inverting a plurality of PUF data.

For example, it will be assumed that the PUF data PDT read from the m-th memory cell Cellm and the n-th memory cell Celln has the logic value of 0. The memory controller 200 may program the PUF data PDT (i.e., data "0") to the m-th memory cell Cellm. As the data "1" is programmed to the n-th memory cell Celln, the memory controller 200 may not program the inverted PUF data (i.e., data "1").

On the contrary, it will be assumed that the PUF data PDT read from the m-th memory cell Cellm and the n-th memory cell Celln have the logic value of 1. The memory controller 200 may program the inverted PUF data (i.e., data "0") to the n-th memory cell Celln. As the data "1" is programed to the m-th memory cell Cellm, the memory controller 200 may not program the PUF data (i.e., data "1").

The memory controller 200 may program the PUF data PDT (i.e., data "0") to the n-th memory cell Celln when the PUF data PDT has the logic value 0, and it may program the inverted PUF data (i.e., data "0") to the m-th memory cell Cellm when the PUF data PDT has the logic value of 1.

The memory controller 200 may read PUF data PDT for each pair of PUF cells by performing the operations 5503 to 5507, and may read a plurality of PUF data PDT by performing the operations 5503 to 5507 multiple times. The memory controller 200 may program the data "0" to the memory cell to which the data "0" is to be programmed from the corresponding pair of PUF cells based on the respective PUF data PDT. After the memory controller 200 is programmed to a plurality of PUF cells, the data "0" may be programmed to one PUF cell from the pair of PUF cells, and the data "1" may be programmed to the other PUF cell.

To sum up, the memory controller 200 may read a plurality of PUF data PDT for respective pages from a plurality of pairs of PUF cells, and may determine the data corresponding to the respective pair of PUF cells connected to the respective bit lines based on the read PUF data PDT, the inverted PUF data, and bit line select information. The memory controller 200 may program the data corresponding to the respective bit lines to the respective PUF cells connected to the bit lines.

At S513, the memory controller 200 reads a plurality of PUF cells to generate security data and ECC parity.

The PUF data PDT and the inverted PUF data may be programmed to a plurality of PUF cells. The memory controller 200 may generate security data based on the PUF data PDT and the inverted PUF data, and the security data is formed by an arrangement of the data "0" or "1" corresponding to one PUF cell.

The memory controller 200 may generate security data by reading data, for respective pages, from a plurality of PUF cells in which the PUF data PDT and inverted values of the PUF data PDT are recorded. For example, the security data may be data in which the PUF data read from a pair of PUF cells and the inverted values of the PUF data are sequentially arranged. Here, a bit sequence in the security data may be different from an order for selecting the PUF cell of bit line select information set to select the PUF cell at the operation S503, and may be identical to an order of the bit lines connected to a plurality of PUF cells. The memory controller 200 has been described in the above to read data in order of bit lines and generate the security data. In various embodiments, the security data may be generated by reading data in reverse order of the order of bit lines or another predetermined order (e.g., reading odd bit lines or even bit lines in forward or reverse order), and the method for the memory controller 200 to read data to generate the security data is not limited to the above-provided description.

For example, it will be assumed that the memory cell array 110 has four bit lines BL1, BL2, BL3, and BL4. It will be assumed that bit line select information includes information selecting the first bit line BL1 and the fourth bit line BL4, and selecting the second bit line BL2 and the third bit line BL3. The memory controller 200 may read first PUF data from a pair of PUF cells configured with the first PUF cell Cell1 connected to the first bit line BL1 and the fourth PUF cell Cell4 connected to the fourth bit line BL4 based on bit line select information. The memory controller 200 may read second PUF data from a pair of PUF cells configured with the second PUF cell Cell2 connected to the second bit line BL2 and the third PUF cell Cell3 connected to the third bit line BL3.

As having read the PUF data from the PUF cells, the memory controller 200 may program the data corresponding to the respective PUF cells to the respective PUF cells. When the first PUF data PDT is "1", the memory controller 200 may program the data that correspond to the respective PUF cell to the respective PUF cells so that the first PUF cell may store the data of "1" and the fourth PUF cell Cell4 may store the data of "0". When the second PUF data PDT is "0", the memory controller 200 may program data that correspond to the respective PUF cells to the respective PUF cells so that the second PUF cell Cell2 may store the data of "1" and the third PUF cell Cell3 may store the data of "0". For example, when the data "1" is programmed to the PUF cell (when the data "1" is programmed to a plurality of PUF cells and the initialization operation of S509 is not performed in S501, or when the data "0" is programmed to a plurality of PUF cells and the initialization operation of S509 is performed in S501), the first PUF data PDT is "1", and the second PUF data PDT is "0", the memory controller 200 may program the data "0" to the third PUF cell Cell3 and the fourth PUF cell Cell4.

The memory controller 200 may read the first PUF cell Cell1, the second PUF cell Cell2, the third PUF cell Cell3, and the fourth PUF cell Cell4 in order of the bit lines, may sequentially arrange 1, 1, 0, and 0 that are respectively stored therein, and may generate the security data of "1100".

The memory controller 200 may perform ECC encoding on the generated security data and may calculate ECC parity.

The memory controller 200 may calculate the ECC parity of the security data by using an error correction algorithm. For example, the error correction algorithm may include coded modulation such as the low density parity code (LDPC), the Bose, Chaudhuri, Hocquenghem (BCH) code, the turbo code, the Reed-Solomon code, the convolution code, the recursive systematic code (RSC), the trellis-coded modulation (TCM), the block coded modulation (BCM), and the majority voting, and embodiments of the present disclosure are not limited thereto.

At S515, the memory controller 200 programs the generated ECC parity to the memory cell array 110.

In detail, the memory controller 200 may program the ECC parity to a PUF cell.

The memory controller 200 may store the ECC parity in a spare region of the memory cell array 110. For example, the memory controller 200 may program the ECC parity to arbitrary memory cells relating to the PUF cell in the spare region.

Charges in the memory cell may be changed as time passes. For example, the charges may be changed by an antenna that may generate interference with memory cells or aging, heating, and/or radiation according to a high altitude above sea level, and a bit flip phenomenon may be generated. As the PUF circuit 120 outputs the PUF data based on a fine difference between output voltages between the PUF cells, the bit flip phenomenon may be generated. However, the memory device 100 according to an embodiment may read the data of the PUF cells of which a difference of the voltages between the PUF cells is amplified through the PUF circuit 120, and may program the PUF data and the inverted value of the PUF data to the PUF cells, thereby reducing the generation number of the bit flip phenomenon.

A method for operating a memory system will now be described with reference to FIG. 6. FIG. 6 shows a PUF circuit according to an embodiment.

Figure 6:
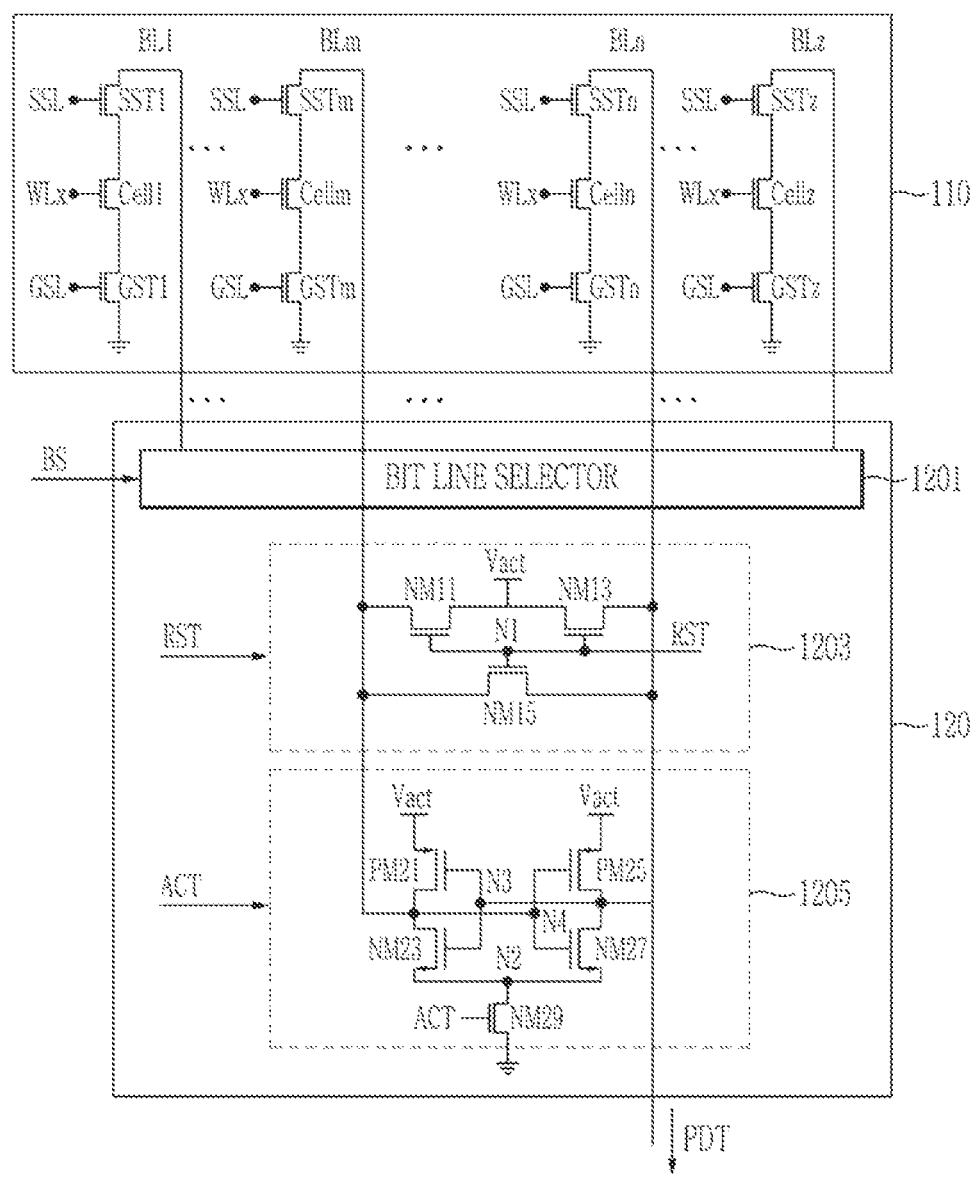
FIG. 6 shows a physical unclonable function (PUF) circuit according to an embodiment.

Referring to FIG. 6, the memory cell array 110 may be connected to the PUF circuit 120 through the bit line BL. The PUF circuit 120 may include a bit line selector 1201, a reset circuit 1203, and an operation circuit 1205.

The bit line selector 1201 may select two arbitrary bit lines from a plurality of bit lines BL1 to BLz based on the bit line select signal BS. For example, the bit line selector 1201 may be realized with a multiplexer, and it is not limited thereto. The bit line selector 1201 may select two bit lines BLm and BLn from a plurality of bit lines BL1 to BLz based on the bit line select signal BS, and may connect the two selected bit lines BLm and BLn to the reset circuit 1203. The bit line select signal BS may include information on the bit line in which the selected pair of PUF cells are positioned. For example, when the m-th memory cell Cellm and the n-th memory cell Celln are selected at S503, the bit line select signal BS may include information on the m-th bit line BLm in which the m-th memory cell Cellm is positioned and the n-th bit line BLn in which the n-th memory cell Celln is positioned. That is, the bit line select signal BS may include bit line select information for the bit line selector 1201 to select two arbitrary bit lines.

The PUF circuit 120 may include the reset circuit 1203 and the operation circuit 1205. In this case, two arbitrary bit lines of the memory cell array 110 may be connected to the reset circuit 1203. That is, the PUF circuit 120 may be positioned between the two bit lines corresponding to a pair of PUF cells.

The reset circuit 1203 may equalize the voltage difference of the selected pair of bit lines. The reset circuit 1203 may electrically short-circuit the two selected bit lines BLm and BLn selected by the bit line selector 1201 based on the reset signal RST. The two bit lines BLm and BLn may be equalized with the reset voltage Vrst.

In detail, the reset circuit 1203 may include an eleventh transistor NM11, a thirteenth transistor NM13, and a fifteenth transistor NM15. The eleventh transistor NM11 and the thirteenth transistor NM13 may be coupled in series between the pair of bit lines. The fifteenth transistor NM15 may be connected between the pair of bit lines. That is, the fifteenth transistor NM15 may be coupled in parallel to the eleventh transistor NM11 and the thirteenth transistor NM13 coupled in series. Gates of the eleventh transistor NM11, the thirteenth transistor NM13, and the fifteenth transistor NM15 may be connected to a reset signal RST supplying line. The reset voltage Vrst may be applied to a first node N1 between the eleventh transistor NM11 and the thirteenth transistor NM13.

The operation circuit 1205 may generate PUF data PDT based on the voltage difference of the two PUF cells Cellm and Celln transmitted through the two selected bit lines BLm and BLn, and may output the PUF data PDT. The operation circuit 1205 may amplify the voltage difference between the PUF cell Cellm connected to the bit line BLm and the PUF cell Celln connected to the bit line BLn and may generate the PUF data PDT. The operation circuit 1205 may output the PUF data PDT on the two selected PUF cells Cellm and Celln based on the act signal ACT.

The operation circuit 1205 may be connected between the pair of bit lines, and may include a sensing amplifier including four transistors. The sensing amplifier may be a cross-coupled latch. In detail, the operation circuit 1205 may include a twenty-first transistor PM21, a twenty-third transistor NM23, a twenty-fifth transistor PM25, and a twenty-seventh transistor NM27. The twenty-first transistor PM21 and the twenty-third transistor NM23 are coupled in series between the second node N2 and the act voltage Vact, and the respective gates are connected to a third node N3 between the twenty-fifth transistor PM25 and the twenty-seventh transistor NM27. The third node N3 is connected to one of the two selected bit lines. The third node N3 is connected to the second bit line BLn. The twenty-fifth transistor PM25 and the twenty-seventh transistor NM27 are coupled in series between the second node N2 and the act voltage Vact, and the respective gates are connected to a fourth node N4 between the twenty-first transistor PM21 and the twenty-third transistor NM23. The fourth node N4 is connected to the other one of the two selected bit lines. Referring to FIG. 6, the fourth node N4 is connected to the first bit line BLm. That is, the PUF cell voltage of the respective bit lines may be provided as respective latch inputs of the cross-coupled latch. The operation circuit 1205 may be connected between the ground and the second node N2, and may further include a twenty-ninth transistor NM29 controlled by the act signal ACT.

The operation circuit 1205 may amplify the difference between the voltage at the first bit line BLm and the voltage at the second bit line BLn. For example, the third node N3 may be connected to one of the act voltage Vact and the ground power source according to the difference between the voltage at the first bit line BLm and the voltage at the second bit line BLn, and the fourth node N4 may be connected to the other one of the act voltage Vact and the ground power source. Hence, the fine difference between the voltage at the first bit line BLm and the voltage at the second bit line BLn may be amplified to be the difference between the act voltage Vact and the ground power source. The operation circuit 1205 may output the voltage at the third node N3 as the PUF data PDT.

An operation for the operation circuit 1205 to output PUF data PDT will now be described with reference to FIG. 7. FIG. 7 shows a timing diagram of a PUF control signal and an output signal of a row decoder according to an embodiment.

Figure 7:
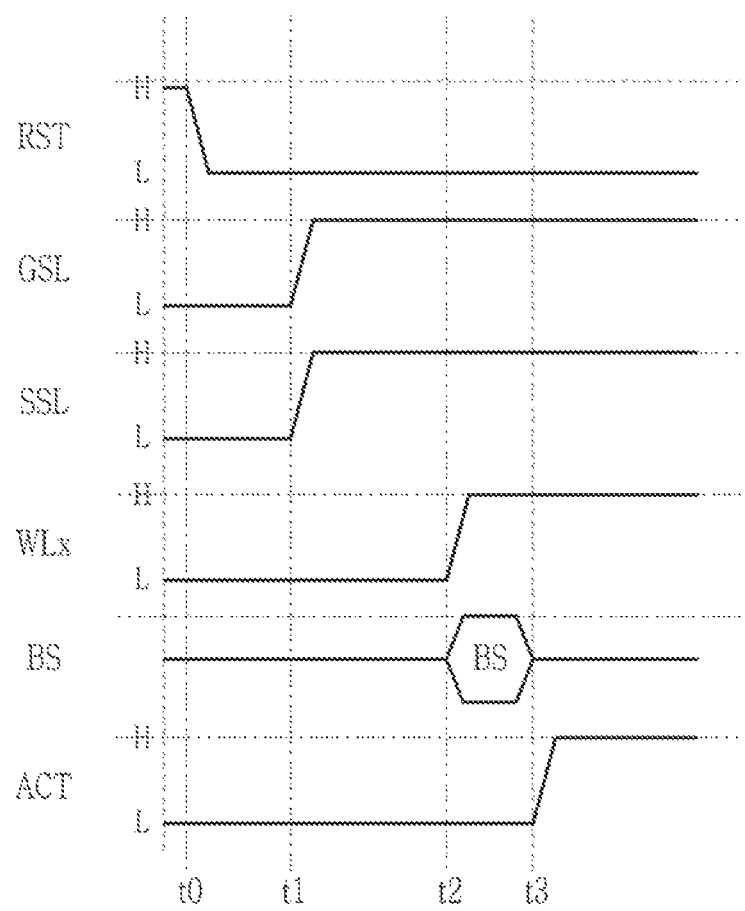
FIG. 7 shows a timing diagram of a PUF control signal and an output signal of a row decoder according to an embodiment.

When the memory device 100 receives a command CMD including a PUF read operation from the memory controller 200, the signals output from the PUF control signal CTRL_PUF and the row decoder 160 through the word line WL, the string select line SSL, and the ground select line GSL may operate as shown in FIG. 7.

Referring to FIG. 5 and FIG. 7, at t0, the reset signal RST may become low level L from high level H. When the reset signal RST becomes high level, the transistors NM11, NM13, and NM15 in the reset circuit 1203 are turned on, and the voltage between the two bit lines BLm and BLn may be equalized to be Vrst.

At t1, the signal transmitted through the string select line SSL and the ground select line GSL may be transitioned to high level H from low level L. Resultantly, the string select transistors SST1 to SSTz and the ground select transistors GST1 to GSTz may be turned on.

At t2, the signal transmitted through the word line WL may be transitioned to high level H from low level L. Resultantly, one word line WLx may be selected. At t2 to t3, the bit line select signal BS may be transmitted to the bit line selector 1201. Accordingly, two arbitrary bit lines BLm and BLn may be selected from the bit lines BL. The respective voltages of the pair of PUF cells Cellm and Celln from a plurality of memory cells Cell to Cellz connected to the word line WLx may be transmitted to the PUF circuit 120 through the bit lines BLm and BLn.

At t3, the act signal RST may be transitioned to high level H from low level L. By the difference between the respective voltages of pair of PUF cells, the PUF data PDT may be generated, and the generated PUF data PDT may be output from the operation circuit 1205.

For example, it will be assumed that the same data of "0" are programmed to the two PUF cells (S501). By the process distribution, rates for the voltages programmed to the respective PUF cells to be reduced may be different. After a predetermined time passes by, the voltages stored in the respective PUF cells may be different from each other. For example, referring to FIG. 6, the voltage at the bit line BLm may have the voltage value of V1 by the voltage stored in the PUF cell Cellm, and the voltage at the bit line BLn may have the voltage value of V2 (here, V1>V2) by the voltage stored in the PUF cell Cellm. The voltage at the fourth node N4 in the operation circuit 1205 may be V1, and the voltage at the third node N3 may be V2. The operation circuit 1205 may amplify the voltages at the two nodes N3 and N4 to be Vact and the ground voltage so the voltage at the third node N3 may become the ground voltage, and the voltage at the fourth node N4 may become the voltage Vact. Hence, the ground voltage (e.g., logic value 0) may be output as the PUF data PDT.

An operation for the memory controller 200 to generate ECC parities or correct errors will now be described with reference to FIG. 8 and FIG. 9.

Figure 8:
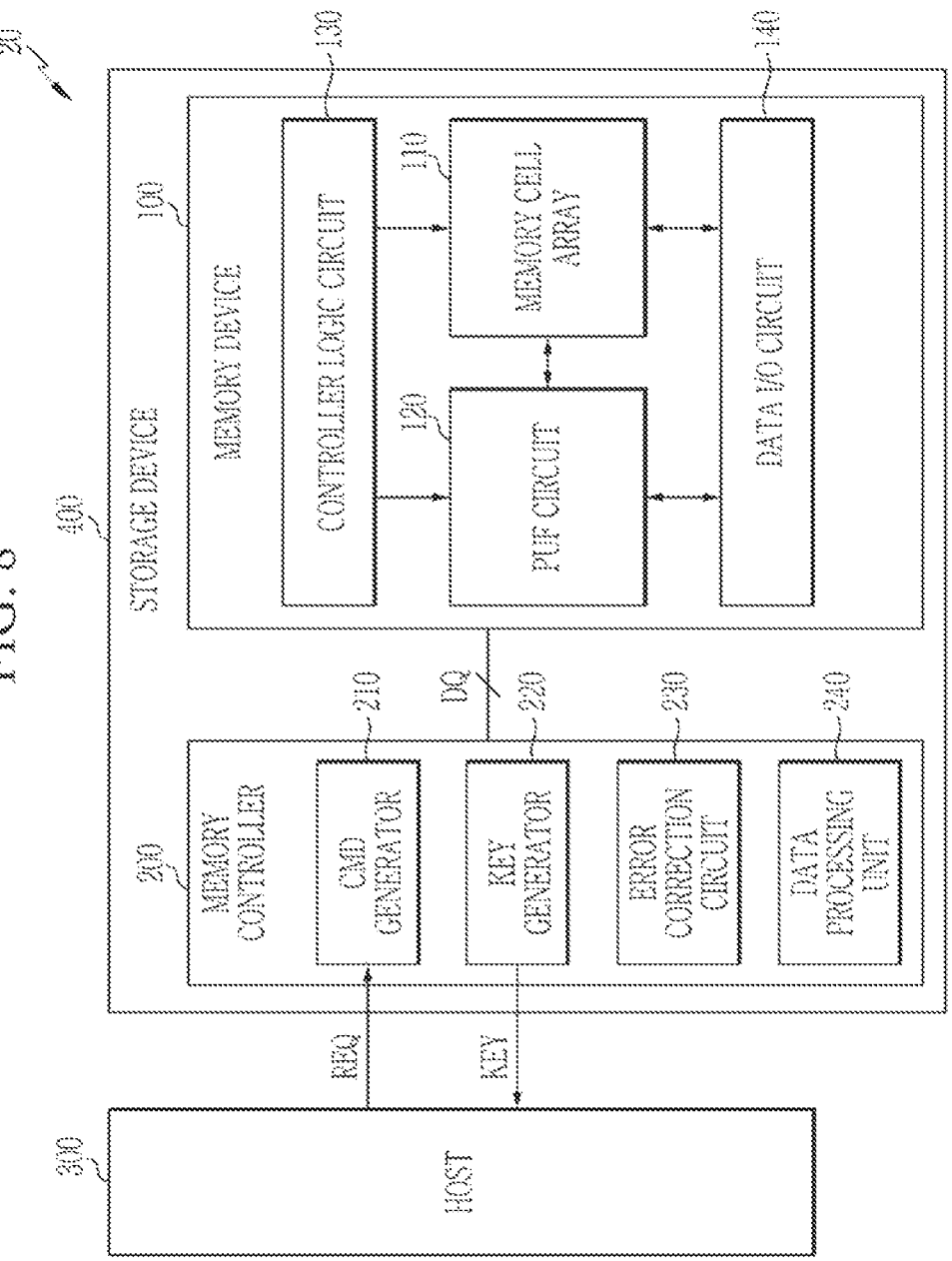
FIG. 8 shows a block diagram of a storage system according to an embodiment.

FIG. 8 shows a block diagram of a storage system according to an embodiment.

Referring to FIG. 8, the storage system 20 may include a host 300 and a storage device 400. The storage device 400 may generate a unique authentication key KEY by using the PUF circuit 120, and may increase security of the storage device 400 as there is less risk of exposure to the outside.

The host 300 may function as a buffer memory for temporarily storing data to be transmitted to the storage device 400 or data transmitted from the storage device 400. The host 300 may transmit an authenticate request REQ to the storage device 400. The storage device 400 may generate the authentication key KEY based on the authenticate request REQ, and may provide the generated authentication key KEY to the host 300. The host 300 may check the received authentication key KEY and may authenticate the storage device 400.

The storage device 400 may be realized to have a self-encrypting drive (SED) form. The storage device 400 may include a memory device 100 and a memory controller 200. For example, the storage device 400 may be the memory system 10 of FIG. 1.

The memory controller 200 generally controls the operation of the storage device 400. The memory controller 200 may control exchanges of data between the memory device 100 and the host 300 that is external to the memory device 100. For example, the memory controller 200 programs data to the memory device 100 or reads data from the memory device 100 by controlling the memory device 100 according to a request by the host 300.

The memory controller 200 may include a command generator 210, a key generator 220, an error correction circuit 230, and a data processing unit 240.

The command generator 210 may generate a command CMD for requesting security data based on the authenticate request REQ received from the host 300. For example, the command CMD for requesting security data may be transmitted to the memory device 100 through a plurality of data signal lines DQ. The command generator 210 may generate an address ADDR for indicating the PUF cell based on the authenticate request REQ received from the host 300. For example, the address ADDR may be transmitted to the memory device 100 through a plurality of data signal lines DQ.

The command generator 210 may generate a command CMD for requesting PUF data. The command generator 210 may generate a command CMD for writing the security data generated by the data processing unit 240 to the corresponding PUF cell in the memory device 100.

The key generator 220 may receive the security data stored in the PUF cell from the memory device 100, and may generate an authentication key based on the received security data.

The error correction circuit 230 may perform an error detecting and correcting function on the security data read from the memory device 100.

When reading data from the memory device 100, the error correction circuit 230 may determine whether there are bit errors in the security data by using the parity bits read from the memory device 100 together with the security data. When the security data are determined to include bit errors, the error correction circuit 230 may perform ECC decoding for correcting errors, and may generate error-corrected security data. When the bit errors are generated multiple times, the error correction circuit 230 may program the error-corrected security data to the PUF cell in the memory device 100. The error correction circuit 230 has been described to be included in the memory controller 200, and without being limited thereto, in various embodiments the error correction circuit 230 may be included in the memory device 100. Accordingly, the error correction circuit 230 may perform an error correction on the security data. The data input and output circuit 140 may transmit the error-corrected security data to the memory controller 200.

The data processing unit 240 may read the PUF data from the memory device 100, and may generate the security data including the PUF data and the inverted value of the PUF data based on the read PUF data. The data processing unit 240 may encode the data received from the host 300 or decode the data read from the memory device 100 based on the authentication key generated by the key generator 220.

The memory device 100 may include a memory cell array 110, a PUF circuit 120, a control logic circuit 130, and a data input and output circuit 140. The memory device 100 and the memory controller 200 may be electrically connected to each other through a plurality of input and output signal lines or a plurality of data signal lines DQ. For example, the command CMD, the address ADDR, and the data DATA of FIG. 1 may be transmitted through a plurality of data signal lines DQ.

Accordingly, the storage device 400 may encode data and program the data based on the authentication key generated based on the security data, and decode the encoded data and the read data, thereby providing a high data protection function.

The storage system 20 may perform secure booting by using a boot image including an authentication key so that manipulated firmware may not be loaded to a booting system that is manipulated from the outside.

In addition, the storage system 20 may include the storage device 400 using the authentication.

Figure 9:
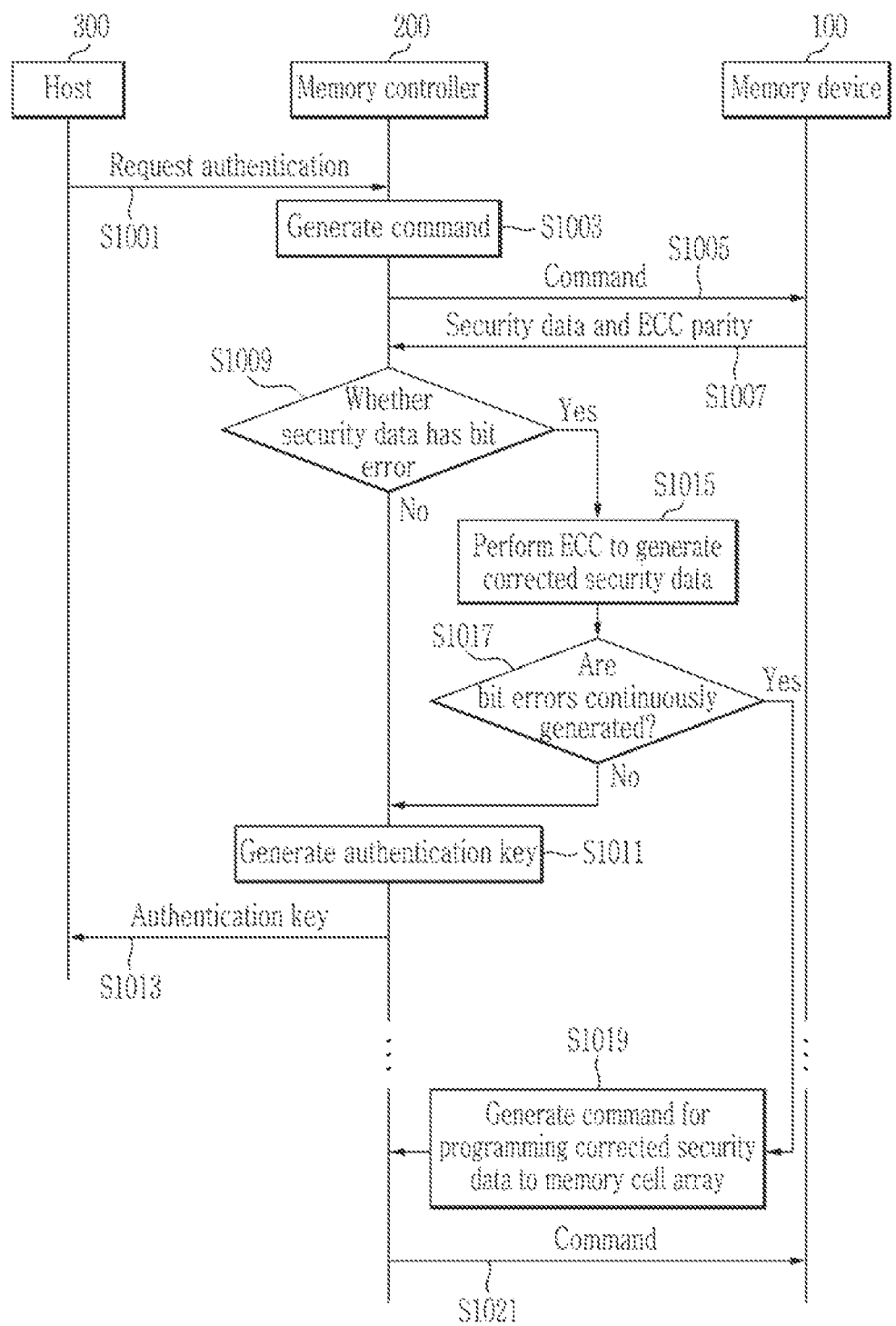
FIG. 9 shows a flowchart of a method for operating a storage system according to an embodiment.

FIG. 9 shows a flowchart of a method for operating a storage system according to an embodiment.

At S1001, the host 300 transmits a storage device authenticate request to the memory controller 200.

At S1003, the memory controller 200 generates a command for generating an authentication key based on the storage device authenticate request.

At S1005, the memory controller 200 transmits the generated command to the memory device 100. For example, the command may read the security data and the ECC parity stored in the memory cell array 110.

At S1007, the memory device 100 reads the security data and the ECC parity from the memory cell array 110, and transmits the same to the memory controller 200.

At S1009, the memory controller 200 determines whether the security data have bit errors by using the received security data and the ECC parity.

At S1011, the memory controller 200 determines that the security data have no bit error, and the memory controller 200 generates the authentication key by using the security data. At S1013, the memory controller 200 transmits the authentication key to the host 300.

At S1015, the memory controller 200 determines that the security data have bit errors, and the memory controller 200 performs error correction on the security data by using an error correction code stored in the ECC parity, and generates error-corrected security data.

At S1017, the memory controller 200 determines whether the bit errors are continuously generated to the security data. For example, the memory controller 200 may count the cases in which the bit errors are detected in the security data, and when the number of times of detecting the bit errors becomes equal to or greater than a predetermined number, the memory controller 200 may determine that the bit errors are continuously generated. Additionally and/or alternatively, when the bit errors are continuously detected for an arbitrary period, the memory controller 200 may determine that the bit errors are consecutively generated. Additionally and/or alternatively, when the number of times of detecting the bit errors in the security data reaches a predetermined percentage compared to the number of times of reading the security data, the memory controller 200 may determine that the bit errors are consecutively generated. Further, the memory controller 200 may determine whether the bit errors are consecutively generated in the security data in various ways, and the ways are not limited to the above-given description.

When the memory controller 200 determines that the bit errors are not consecutively generated, the memory controller 200 proceeds to S1011.

When the memory controller 200 determines that the bit errors are consecutively generated, the memory controller 200 proceeds to S1019. At S1019, the memory controller 200 generates a command for programming the corrected security data generated at S1015 to the memory cell array of the memory device 100.

At S1021, the memory controller 200 transmits the generated command to the memory device 100.

Figure 10:
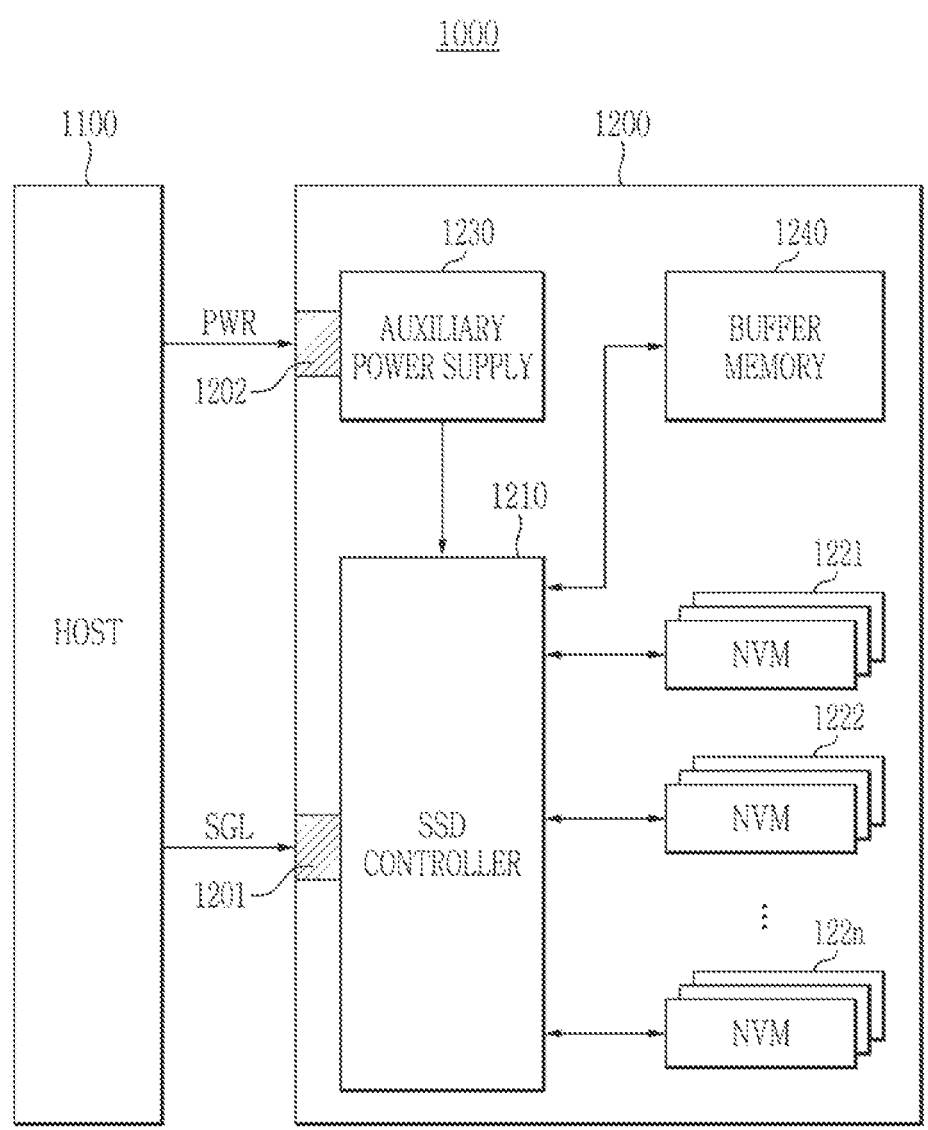
FIG. 10 shows a block diagram of a solid-state drive (SSD) system to which a memory device according to an embodiment is applied.

FIG. 10 shows a block diagram of a SSD system to which a memory device according to an embodiment is applied.

Referring to FIG. 10, the SSD system 1000 may include a host 1100 and an SSD 1200. The SSD 1200 transmits and receives signals to/from the host 1100 through a signal connector, and receives a power voltage through a power connector. The SSD 1200 may include a SSD controller 1210, an auxiliary power supply 1230, a buffer memory 1240, and memory devices 1221, 1222, and 122n. The memory devices 1221, 1222, and 122n may be NAND flash memory devices. The SSD 1200 may be realized in accordance with the various embodiments described with reference to FIG. 1 to FIG. 9.

In various embodiments the memory devices 1221, 1222, and 122n may include PUF circuits. However, technical characteristics of the disclosure are not limited to the memory device(s). As described above, the SSD controller 1210 may generate the security data by using the PUF data output by the PUF circuit. The SSD controller 1210 may write the security data to the memory devices 1221, 1222, and 122n, and may generate the authentication key by using the written security data.

While example embodiments of the disclosure have been shown and described, the disclosure is not limited to the aforementioned specific embodiments, and it is apparent that various modifications can be made by those having ordinary skill in the technical field to which the disclosure belongs, without departing from the gist of the disclosure as claimed by the appended claims and their equivalents. Also, it is intended that such modifications are not to be interpreted independently from the technical idea or prospect of the disclosure.

What is claimed is:

1. A storage device comprising:
a memory cell array comprising a plurality of memory cells connected to a plurality of word lines and a plurality of bit lines;
a physical unclonable function (PUF) circuit configured to output PUF data signifying at least one unique value based on a voltage difference between two memory cells from among the plurality of memory cells, the two memory cells being connected to a word line from among the plurality of word lines and two bit lines from among the plurality of bit lines, and to which a same data are programmed; and
a memory controller configured to:
receive the PUF data from the PUF circuit,
program a value of the PUF data or an inverted value of the PUF data to one of the two memory cells, and
generate security data in which the PUF data and the inverted value of the PUF data are sequentially arranged in an order of the two bit lines.

2. The storage device of claim 1, wherein the PUF circuit comprises:
a reset circuit configured to equalize a voltage difference between the two bit lines; and
an operation circuit connected to the two bit lines, and configured to generate the PUF data by amplifying the voltage difference between the two memory cells.

3. The storage device of claim 2, wherein the PUF circuit further comprises:
a bit line selector configured to select the two bit lines from among the plurality of bit lines, and
the reset circuit and the operation circuit are connected to the two bit lines selected by the bit line selector.

4. The storage device of claim 1, wherein the memory controller is further configured to perform error correction code (ECC) encoding on the security data to generate ECC parity, and program the ECC parity to a memory cell relating to the two memory cells.

5. The storage device of claim 1, wherein the plurality of memory cells comprise a set of memory cell pairs, and respective memory cell pairs in the set include one pair of memory cells,
the PUF circuit is further configured to output a plurality of PUF data that correspond to a number of memory cell pairs in the set of memory cell pairs, and
the memory controller is further configured to generate security data in which the PUF data and inverted values of respective PUF data are sequentially arranged in the order of the two bit lines.

6. The storage device of claim 5, wherein the security data is configured based on logic values that correspond to the respective memory cells, and
the memory controller is further configured to perform ECC encoding on the security data to generate ECC parity, program the security data to a corresponding memory cell, and program the ECC parity to a memory cell relating to the corresponding memory cell.

7. A storage system comprising:
a memory device comprising a plurality of memory cells connected to a plurality of word lines and a plurality of bit lines, wherein the plurality of memory cells are programmed with security data and error correction code (ECC) parity on the security data;
a physical unclonable function (PUF) circuit configured to output PUF data signifying at least one unique value; and
a memory controller configured to:
receive the PUF data from the PUF circuit;
program a value of the PUF data or an inverted value of the PUF data to one of the plurality of memory cells;
generate the security data in which the PUF data and the inverted value of the PUF data are arranged;
generate an authentication key based on the security data.

8. The storage system of claim 7, wherein the memory controller is further configured to:

detect a bit error in the security data based on the ECC parity, and based on detecting the bit error, perform ECC decoding on the security data to generate error-corrected security data.

9. The storage system of claim 8, wherein the memory controller is further configured to generate the authentication key based on the error-corrected security data.

10. The storage system of claim 8, wherein the memory controller is further configured to program the error-corrected security data to the plurality of memory cells based on detecting the bit error in the security data more than a predetermined number of times.

11. A method for operating a storage device, the method comprising:

programming same data to a plurality of memory cell pairs corresponding to each of a plurality of bit lines;

reading physical unclonable function (PUF) data signifying at least one unique value based on a voltage difference between a first memory cell and a second memory cell included in a respective memory cell pair among the plurality of memory cell pairs;

programming one of a value of the PUF data and an inverted value of the PUF data to the first memory cell or the second memory cell; and generating security data based on values stored in the first memory cell and the second memory cell.

12. The method of claim 11, wherein the reading the PUF data comprises:

short-circuiting a first bit line connected to the first memory cell and a second bit line connected to the second memory cell; and releasing the short-circuit between the first bit line and the second bit line, and amplifying the voltage difference between the first memory cell and the second memory cell to read the PUF data.

13. The method of claim 12, wherein programming the same data to the plurality of memory cell pairs comprises:

initializing the plurality of memory cell pairs; and programming data "0" to the initialized plurality of memory cell pairs.

14. The method of claim 11, wherein the generating the security data further comprises:

selecting a memory cell pair programmed with the same data based on bit line select information including information on an order of two arbitrary bit lines selected from the plurality of bit lines; and sequentially arranging values stored in the first memory cell and the second memory cell of the selected memory cell pair in the order of the two arbitrary bit lines to generate the security data.

15. The method of claim 11, wherein the method further comprises:

calculating error correction code (ECC) parity by performing an ECC encoding on the security data; and programming the security data to the respective memory cell pairs from which corresponding PUF data are read, and programming the ECC parity to a memory cell relating to the plurality of memory cell pairs.

16. The method of claim 15, wherein the method further comprises:

reading the security data and the ECC parity from the plurality of memory cell pairs;

detecting a bit error in the security data by using the ECC parity; and based on the bit error being detected in the security data, performing ECC decoding based on the ECC parity to generate error-corrected security data.

17. The method of claim 16, wherein the method further comprises:

based on the bit error not being detected in the security data, generating an authentication key based on the security data.

18. The method of claim 16, wherein the method further comprises:

generating an authentication key based on the error-corrected security data.

19. The method of claim 16, wherein the method further comprises:

based on the bit error being detected in the security data more than a predetermined number of times, programming the error-corrected security data to a plurality of memory cells.

* * * * *